(12) United States Patent
Navarro et al.

(10) Patent No.: US 9,976,053 B2
(45) Date of Patent: May 22, 2018

(54) PROCESS FOR CONTROLLING THE PERIOD OF A NANOSTRUCTURED BLOCK COPOLYMER FILM BASED ON STYRENE AND ON METHYL METHACRYLATE, AND NANOSTRUCTURED BLOCK COPOLYMER FILM

(71) Applicant: Arkema France, Colombes (FR)

(72) Inventors: Christophe Navarro, Bayonne (FR); Celia Nicolet, Talence (FR); Xavier Chevalier, Grenoble (FR)

(73) Assignee: ARKEMA FRANCE, Colombes (FR)

( * ) Notice: Subject to any disclaimer, the term of this patent is extended or adjusted under 35 U.S.C. 154(b) by 0 days. days.

(21) Appl. No.: 15/317,803

(22) PCT Filed: Jun. 1, 2015

(86) PCT No.: PCT/FR2015/051430
§ 371 (c)(1),
(2) Date: Dec. 9, 2016

(87) PCT Pub. No.: WO2015/189495
PCT Pub. Date: Dec. 17, 2015

(65) Prior Publication Data
US 2017/0145250 A1    May 25, 2017

(30) Foreign Application Priority Data

Jun. 11, 2014 (FR) ...................... 14 55294

(51) Int. Cl.
| | | |
|---|---|---|
| G03F 7/00 | (2006.01) | |
| C08L 53/00 | (2006.01) | |
| C09D 153/00 | (2006.01) | |
| C08F 297/02 | (2006.01) | |
| B05D 1/00 | (2006.01) | |

(52) U.S. Cl.
CPC ........... *C09D 153/00* (2013.01); *B05D 1/005* (2013.01); *C08F 297/026* (2013.01); *C08L 53/00* (2013.01); *G03F 7/0002* (2013.01)

(58) Field of Classification Search
CPC ....... C08L 53/00; C09D 153/00; G03F 7/002; G03F 297/00; C08F 297/026
(Continued)

(56) References Cited

U.S. PATENT DOCUMENTS 5,677,387 A    10/1997  Bayard et al.
5,886,112 A    3/1999   Vuillemin et al.
(Continued)

FOREIGN PATENT DOCUMENTS

EP    0524054 A1    1/1993
EP    0749987 A1    12/1996
(Continued)

OTHER PUBLICATIONS

Machine translation of JP 2005-029779 (no date).*
(Continued)

*Primary Examiner* — Amanda C Walke
(74) *Attorney, Agent, or Firm* — RatnerPrestia

(57) ABSTRACT

The invention relates to a block copolymer film nanostructured into nanodomains, obtained from a base block copolymer having a molecular weight of greater than 50 kg/mol, and preferably greater than 100 kg/mol and less than 250 kg/mol, and at least one block of which comprises styrene, and at least one other block of which comprises methyl methacrylate. This film is characterized in that the styrene-based block is formed by a copolymer of styrene and diphenylethylene (DPE).

23 Claims, 3 Drawing Sheets

Figure 1:
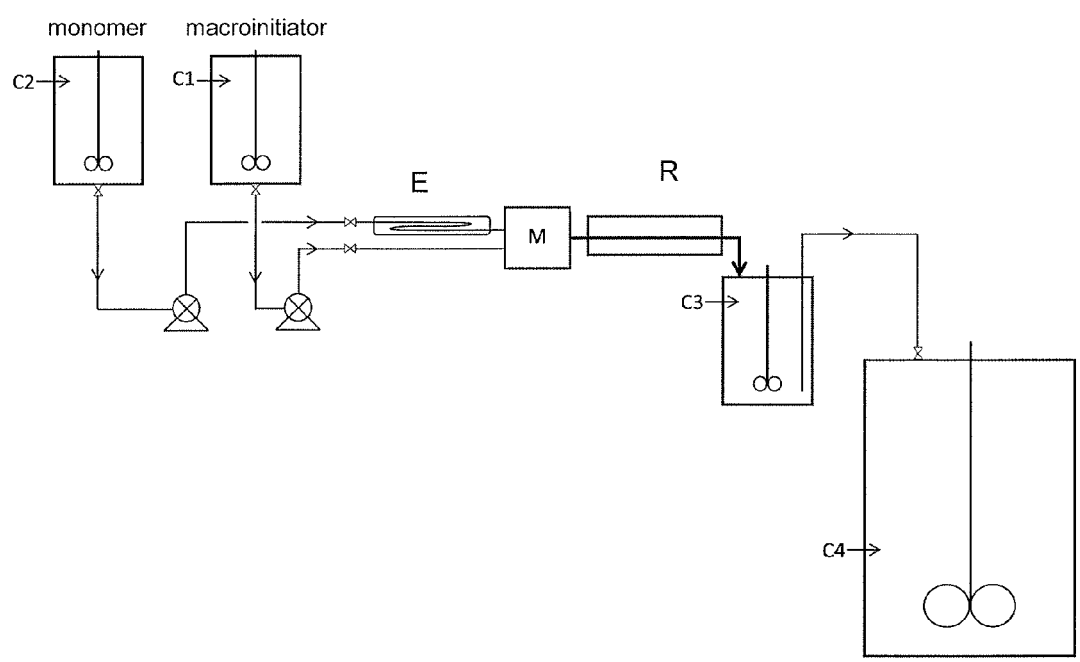

| Block copolymer | Annealing | | Thickness (nm) | Period Lo (nm) | photos |
|---|---|---|---|---|---|
| | T°(C) | Time (min) | | | |
| C35 | 220 | 2 | 19 | 30 | |
| C35 1DPE | 220 | 2 | 20 | 36 | |
| C35 10DPE | 210 | 2 | 44 | >40 | |
| C50 | 250 | 2 | 25 | 41 | |
| C50 10DPE | 225 | 2 | 18 | >50 | |
| | 230 | 2 | 23 | >50 | |

(58) Field of Classification Search
USPC .......... 522/112; 524/505; 430/270.1; 525/88
See application file for complete search history.

(56) References Cited

U.S. PATENT DOCUMENTS

| | | | |
|---|---|---|---|
| 8,304,493 B2 | 11/2012 | Millward et al. | |
| 8,450,418 B2 | 5/2013 | Millward et al. | |
| 2011/0257335 A1* | 10/2011 | Knoll | C08F 297/04 525/89 |
| 2013/0209696 A1 | 8/2013 | Sharma et al. | |
| 2014/0127418 A1 | 5/2014 | Navarro et al. | |

FOREIGN PATENT DOCUMENTS

| | | | |
|---|---|---|---|
| FR | 2974094 A1 | 10/2012 |
| JP | 2005029779 A | 2/2005 |
| WO | 2013019679 A1 | 2/2013 |

OTHER PUBLICATIONS

Rodwogin et al., "Polylactide—Poly(dimethylsiloxane)—Polylactide Triblock Copolymers as Multifunctional Materials for Nanolithographic Applications", ACS Nano, vol. 4, No. 2, pp. 725-732.
Zhao et al., SAXS Analysis of the Order—Disorder Transition and the Interaction Parameter of Polystyrene-block-poly (methyl methacrylate), Macromolecules 2008, vol. 41, pp. 9948-9951.
Takahashi et al,.., "Defectivity in Laterally Confined Lamella-Forming Diblock Copolymers Thermodynamic and Kinetic Aspects", Macromolecules, 2012, vol. 45, pp. 6253-6265.
International Search Report and Written Opinion for International Application No. PCT/FR2015/051430, dated Aug. 3, 2015, 7 Pages.
Mansky et al., "Contolling Polymer-Surface Interactions with Random Copolymer Brushes", Science, vol. 275, Mar. 7, 1997, pp. 458-1460, 4 Pages.

* cited by examiner

| Block copolymer | Annealing | | Thickness (nm) | Period Lo (nm) | photos |
|---|---|---|---|---|---|
| | T°(C) | Time (min) | | | |
| C35 | 220 | 2 | 19 | 30 |  |
| C35 1DPE | 220 | 2 | 20 | 36 |  |
| C35 10DPE | 210 | 2 | 44 | >40 |  |
| C50 | 250 | 2 | 25 | 41 |  |
| C50 10DPE | 225 | 2 | 18 | >50 |  |
| | 230 | 2 | 23 | >50 |  |

PROCESS FOR CONTROLLING THE PERIOD OF A NANOSTRUCTURED BLOCK COPOLYMER FILM BASED ON STYRENE AND ON METHYL METHACRYLATE, AND NANOSTRUCTURED BLOCK COPOLYMER FILM

CROSS-REFERENCE TO RELATED APPLICATIONS

This is the national phase of International Application No. PCT/FR2015/051430, filed 1 Jun. 2015, which claims priority to French Application No. 1455294, filed 11 Jun. 2014. The disclosure of each of these applications is incorporated herein by reference in its entirety for all purposes.

FIELD OF THE INVENTION

The present invention relates to the field of nanostructured block copolymers having nanodomains oriented in a particular direction.

More particularly, the invention relates to a film of block copolymer based on styrene and on methyl methacrylate having a high phase segregation and a large period, preferably of greater than 30 nm and more preferably still of greater than 50 nm and less than 100 nm. The invention also relates to a process for controlling the period of a nanostructured block copolymer film, using a base block copolymer comprising styrene and methyl methacrylate.

The term "period", denoted by Lo in the remainder of the description, is understood to mean the minimum distance separating two neighbouring domains having the same chemical composition, separated by a domain having a different chemical composition.

PRIOR ART

The development of nanotechnologies has made it possible to constantly miniaturize products in the field of microelectronics and micro-electro-mechanical systems (MEMS) in particular. Today, conventional lithography techniques no longer make it possible to meet these constant needs for miniaturization, as they do not make it possible to produce structures with dimensions of less than 60 nm.

It has therefore been necessary to adapt the lithography techniques and create etching masks that make it possible to create increasingly small patterns with a high resolution. With the block copolymers it is possible to structure the arrangement of the constituent blocs of the copolymers, by phase segregation between the blocks thus forming nanodomains, on scales of less than 50 nm. Due to this ability to be nanostructured, the use of block copolymers in the fields of electronics or optoelectronics is now well known.

Among the masks studied for carrying out nanolithography, block copolymer films, in particular based on polystyrene-b-poly(methyl methacrylate), denoted hereinafter PS-b-PMMA, appear to be very promising solutions since they make it possible to create patterns with a high resolution. In order to be able to use such a block copolymer film as an etching mask, one block of the copolymer must be selectively removed in order to create a porous film of the residual block, the patterns of which may be subsequently transferred by etching to an underlying layer. Regarding the PS-b-PMMA film, the PMMA (poly(methyl methacrylate)), is usually removed selectively in order to create a mask of residual PS (polystyrene).

Document JP2005 029779 describes a PS-b-PMMA block copolymer film capable of being nanostructured into nanodomains at an annealing temperature of between 135° C. and 210° C., the copolymer film having a molecular weight of the order of 78.2 kg/mol. For this, that document describes a conventional anionic polymerization reaction, according to which, so that the MMA block can polymerize onto the PS block, an entity DPE is added at the chain end of the PS block in order to create reactivity conditions necessary in order for the PMMA to polymerize. The copolymer synthesized is then a copolymer of the PS-DPE-PMMA type.

In order to create such masks, the nanodomains must be oriented perpendicular to the surface of the underlying layer. Such structuring of the domains requires particular conditions such as the preparation of the surface of the underlying layer, but also the composition of the block copolymer.

An important factor is the phase segregation factor, also known as the Flory-Huggins interaction parameter and denoted by "$\chi$". Specifically, this parameter makes it possible to control the size of the nanodomains. More particularly, it defines the tendency of the blocks of the block copolymer to separate into nanodomains. Thus, the product $\chi N$, of the degree of polymerization N, and of the Flory-Huggins parameter $\chi$, gives an indication as to the compatibility of two blocks and whether they may separate. For example, a diblock copolymer of strictly symmetrical composition separates into microdomains if the product $\chi N$ is greater than 10.49. If this product $\chi N$ is less than 10.49, the blocks mix together and phase separation is not observed at the observation temperature.

Due to the constant needs for miniaturization, it is sought to increase this degree of phase separation, in order to produce nanolithography masks that make it possible to obtain very high resolutions, typically of less than 20 nm, and preferably of less than 10 nm, while retaining certain base properties of the block copolymer, such as the high glass transition temperature Tg, the good temperature resistance of the block copolymer, or a depolymerization of the PMMA under UV treatment when the block copolymer is a PS-b-PMMA, etc.

In Macromolecules, 2008, 41, 9948, Y. Zhao et al. estimated the Flory-Huggins parameter for a PS-b-PMMA block copolymer. The Flory-Huggins parameter $\chi$ obeys the following equation: $\chi = a + b/T$, where the values a and b are constant specific values dependent on the nature of the blocks of the copolymer and T is the temperature of the heat treatment applied to the block copolymer in order to enable it to organize itself, i.e. in order to obtain a phase separation of the domains, an orientation of the domains and a reduction in the number of defects. More particularly, the values a and b respectively represent the entropic and enthalpic contributions. Thus, for a PS-b-PMMA block copolymer, the phase segregation factor obeys the following equation: $\chi = 0.0282 + 4.46/T$.

This low value of the Flory-Huggins interaction parameter therefore limits the advantage of block copolymers based on PS and PMMA for the production of structures having very high resolutions.

In order to get round this problem, M. D. Rodwogin et al., ACS Nano, 2010, 4, 725, demonstrated that it is possible to change the chemical nature of the blocks of the block copolymer in order to very greatly increase the Flory-Huggins parameter $\chi$ and to obtain a desired morphology with a very high resolution, i.e. the size of the nanodomains of which is less than 10 nm. These results were in particular demonstrated for a triblock copolymer of PLA-b-PDMS-b-PLA (poly(lactic acid)-block-poly(dimethylsiloxane)-block-poly(lactic acid)).

H. Takahashi et al., Macromolecules, 2012, 45, 6253, studied the influence of the Flory-Huggins interaction parameter $\chi$ on the kinetics of copolymer assembly and of reduction of defects in the copolymer. They demonstrated in particular that when this parameter $\chi$ becomes too large, there is generally a considerable slowing of the assembly kinetics and of the phase segregation kinetics, also leading to a slowing down of the kinetics of defect reduction at the time of domain organization.

U.S. Pat. No. 8,304,493 and U.S. Pat. No. 8,450,418 describe a process for modifying base block copolymers, the interaction parameter $\chi$ of which is high, and also modified block copolymers. These block copolymers are modified in order to reduce the value of the Flory-Huggins interaction parameter $\chi$, so that the block copolymer can be structured into nanodomains of small sizes with faster kinetics. More particularly, these documents seek to reduce the Flory-Huggins parameter $\chi$ of a PS-b-PDMS (polystyrene-block-poly(dimethylsiloxane)) block copolymer, the nanodomains of which are oriented parallel to the surface on which they are deposited. The kinetics of assembly of the block copolymers described in these documents still remain, however, very slow since they may last a few hours, typically up to 4 hours.

The impact of the modification of at least one block of a base block copolymer of PS-b-PMMA type on the parameter $\chi$ and on the kinetics of structuring the block copolymer into nanodomains has been demonstrated. However, two other parameters are also important. These are, on the one hand, the ratios between the blocks that make it possible to control the shape of the nanodomains (arrangement in the form of lamellae, cylinders, spheres, etc.) and, on the other hand, the molecular weight of each block which makes it possible to control the size and spacing of the blocks, i.e. the period of the block copolymer, denoted by Lo. However, when it is desired to control the period of the block copolymer, so that this period is large and above a threshold value of 30 nm for example, large polymer chains having a high degree of polymerization N are necessary in order to form large blocks and therefore large periods.

Consequently, when it is desired to control the period of a block copolymer film, it is necessary to control the length of the constituent polymer chains of each of the blocks. By way of example, in order to be able to produce a PS-b-PMMA block copolymer film having a large period Lo, for example greater than 30 nm, and more preferably still greater than 50 nm and less than 100 nm, the molecular weights of each of the blocks must be greater than 15 kg/mol.

However, such a block copolymer, the blocks of which are formed by large polymers, then has a very high product $\chi N$ and the nanostructuring thereof requires a lot of energy. Indeed, the annealing necessary for the organization of the blocks must be carried out at very high temperatures greater than or equal to 230° C., in general of the order of 250° C. over a relatively long time, in general of 2 to 4 hours, which then favours the degradation of the polymer and the appearance of defects in the final block copolymer.

Consequently, in order to control the period Lo of a nanostructured block copolymer so that it is large, typically greater than 30 nm and more preferably still greater than 50 nm and less than 100 nm, it is necessary to control the adjustment of the product $\chi N$. Indeed, it is necessary that the Flory-Huggins parameter $\chi$ be sufficient to enable an optimal phase segregation between the blocks while having a high degree of polymerization N in order to enable a large period, preferably of greater than 30 nm, to be obtained.

Document WO 2013/019679 describes the possibility of modifying at least one of the blocks of a base block copolymer. The modification of at least one of the blocks of the block copolymer has an influence on the surface and interfacial energies of the nanodomains and entails a modification of the morphology and of the orientation of the nanodomains in the block copolymer. This document remains silent regarding the kinetics of organization of the modified block copolymer and does not seek to increase the period of the nanostructured block copolymer.

Due to the fact that PS-b-PMMA block copolymers make it possible to produce nanolithography masks that offer a good resolution, the applicant has sought a solution for modifying this type of block copolymer in order to be able to control the period thereof, and in particular to obtain a period which is greater than a threshold value of 30 nm and more preferably still greater than 50 nm and less than 100 nm, with rapid nanostructuring kinetics and a significantly reduced defectivity.

More particularly, the applicant has sought a solution for modifying such a block copolymer of PS-b-PMMA type, so as to be able to increase its period Lo, without the appearance of defects due to an excessively high nanostructuring temperature and/or to excessively slow nanostructuring kinetics.

Technical Problem

The objective of the invention is therefore to overcome at least one of the drawbacks of the prior art. The invention aims in particular to provide a process for controlling the period of nanostructuring, into nanodomains, of a block copolymer film using a base block copolymer having a molecular weight of greater than 50 kg/mol, and preferably greater than 100 kg/mol and less than 250 kg/mol, and at least one block of which contains polystyrene, and at least one block of which contains methyl methacrylate.

For this, the block copolymer is modified so that the product $\chi N$ is greater than or equal to 7 and preferably greater than or equal to 10 in order to allow good phase segregation between the nanodomains and a large period Lo, preferably of greater than 30 nm and more preferably still greater than 50 nm and less than 100 nm, to be obtained. The nanostructuring process must also allow a very rapid organization of the block copolymer with organization kinetics of the order of 1 to a few minutes, this being at a temperature, referred to as annealing temperature, below the degradation temperature of the polymer.

The invention also aims to provide a block copolymer film nanostructured into nanodomains, obtained from a base block copolymer, having a molecular weight of greater than 50 kg/mol, and preferably greater than 100 kg/mol and less than 250 kg/mol, and at least one block of which comprises styrene, and at least one block of which comprises methyl methacrylate, said copolymer being modified in order to be nanostructured with a large period, with fast organization kinetics of the blocks and/or at a temperature below the degradation temperature of the copolymer.

BRIEF DESCRIPTION OF THE INVENTION

Surprisingly, it has been discovered that a block copolymer film nanostructured into nanodomains, obtained from a base block copolymer having a molecular weight of greater than 50 kg/mol, and preferably greater than 100 kg/mol and less than 250 kg/mol, and at least one block of which comprises styrene, and at least one other block of which comprises methyl methacrylate, said block copolymer film being characterized in that the styrene-based block is formed by a copolymer of styrene and diphenylethylene (DPE), makes it possible to obtain a value χN in the desired range and makes it possible to obtain nanodomains with a large period Lo, typically of greater than 30 nm, while enabling organization at a temperature below that required for organizing the blocks of the base, i.e. unmodified, PS-b-PMMA block copolymer and while retaining fast organization kinetics with a reduced defectivity with respect to that obtained with said base PS-b-PMMA block copolymer.

The invention also relates to a process for controlling the period of nanostructuring, into nanodomains, of a block copolymer film using a base block copolymer having a molecular weight of greater than 50 kg/mol, and preferably greater than 100 kg/mol and less than 250 kg/mol, and at least one block of which comprises styrene, and at least one other block of which comprises methyl methacrylate, said process being characterized in that it comprises the following steps:

synthesis of said block copolymer by incorporating, into the block of said base block copolymer containing styrene, one or more diphenylethylene (DPE) comonomers, application of a solution of said block copolymer in the form of a film to a surface, evaporation of the solvent of the solution and annealing at said predetermined temperature.

The invention finally relates to a nanolithography mask obtained from a film of said block copolymer described above, deposited on a surface to be etched in accordance with the above process, said copolymer film comprising nanodomains oriented perpendicular to the surface to be etched and having a period Lo of greater than 30 nm and more preferably still greater than 50 nm and less than 100 nm.

Figure 2:
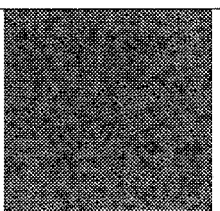
Figure 2:
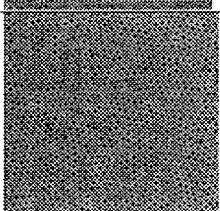
Figure 2:
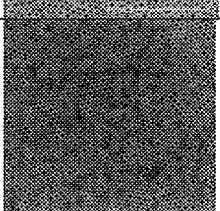
Figure 2:
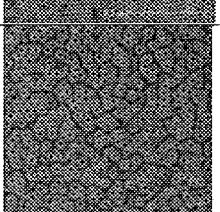
Figure 2:
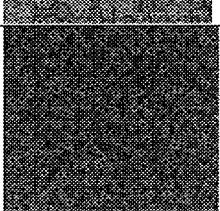
Figure 2:
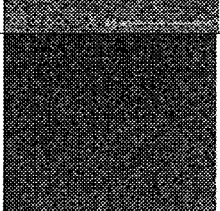
Figure 3:
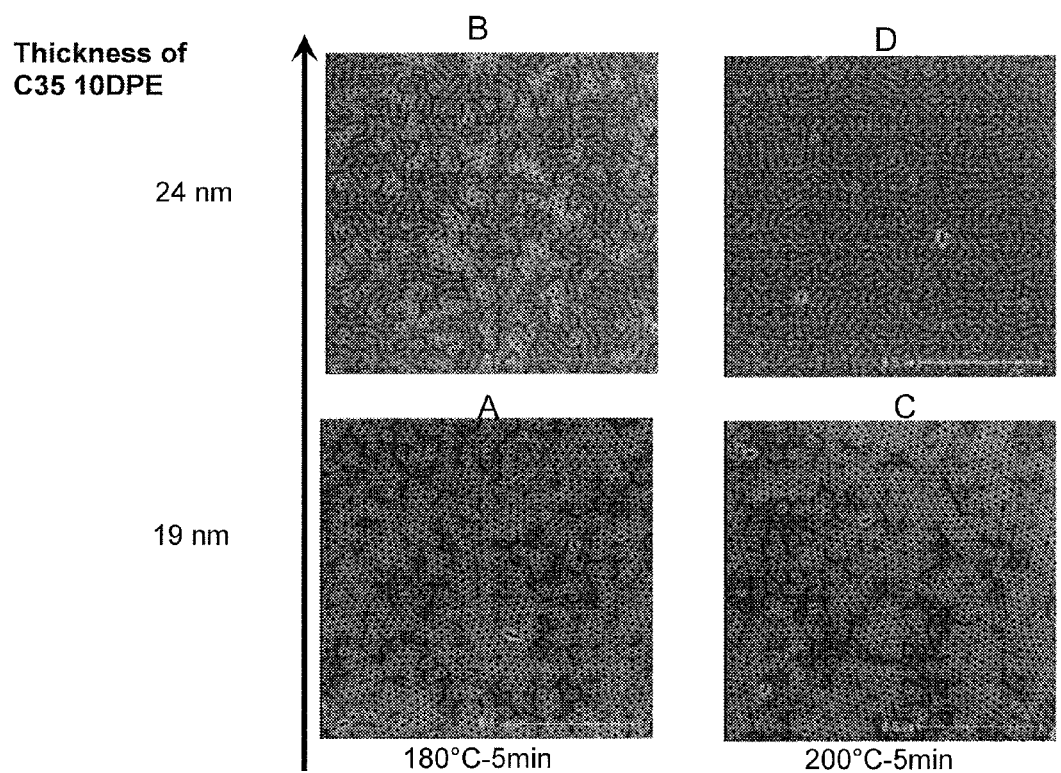
Figure 4:
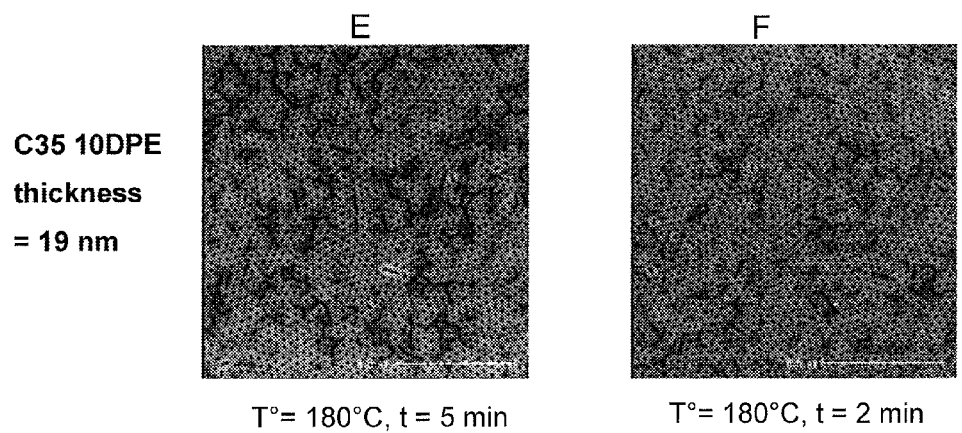

Other features and advantages of the invention will appear on reading the description given by way of illustrative and nonlimiting example, with reference to the appended figures, which represent:

FIG. 1, a diagram of an example of polymerization equipment that can be used,

FIG. 2, photos, taken with a scanning electron microscope, of various samples of nanostructured block copolymer, of different and modified or unmodified composition, FIG. 3, photos, taken with a scanning electron microscope, of several samples of a same modified block copolymer having 2 different thicknesses and having undergone 2 different heat treatments, FIG. 4, photos, taken with a scanning electron microscope, of two samples of a same modified block copolymer having undergone a heat treatment for 2 different durations.

DETAILED DESCRIPTION OF THE INVENTION

The term "monomer" as used relates to a molecule which can undergo polymerization.

The term "polymerization" as used relates to the process of converting a monomer or a mixture of monomers into a polymer.

The term "copolymer block" or "block" is understood to mean a polymer that groups together several monomer units of several types, or of a same type.

The term "block copolymer" is understood to mean a polymer comprising at least two blocks as defined above, the two blocks being different from one another and having a phase segregation parameter such that they are not miscible and separate into nanodomains.

The term "miscibility" used above is understood to mean the ability of two compounds to mix together completely in order to form a homogeneous phase.

In the description, when the molecular weight of the block copolymer is referred to, this is the molecular weight at the peak, Mp, measured by size exclusion chromatography (SEC).

The principle of the invention consists in modifying the chemical structure of a base PS-b-PMMA block copolymer, while retaining styrene and methyl methacrylate units in each block, by introducing diphenylethylene, also denoted hereafter by DPE, during the polymerization reaction of the polystyrene-based block. This introduction of diphenylethylene into the polystyrene-based block induces a modification of the mobility of the structure of the P(S-co-DPE)-b-PMMA block copolymer obtained.

Owing to this incorporation of DPE into the styrene-based block, it has been observed that, at identical chain length and therefore at identical degree of polymerization N, the annealing time and the annealing temperature of the P(S-co-DPE)-b-PMMA block copolymer according to the invention are shorter than the annealing time and below the annealing temperature of the initial, unmodified PS-b-PMMA block copolymer.

To date, it has not been possible, at identical chain length, to rapidly nanostructure an unmodified PS-b-PMMA block copolymer having a large period, for example of greater than 30 nm, without the appearance of defects, or even without destruction, whereas this becomes possible with the copolymer modified by the introduction of DPE into the PS block.

The chain length of the P(S-co-DPE)-b-PMMA block copolymer obtained will be chosen depending on the desired nanostructuring period Lo. The incorporation of DPE into the PS block makes it possible to gradually adjust the value of the product χN for the nanostructured block copolymer film. In order to determine the amount of DPE to be incorporated into the PS block, use could be made of nomograms that make it possible to determine the relationship between the content of DPE in the block copolymer and the product χN on the one hand, and between the degree of polymerization N and the period Lo on the other hand.

This modification of the structure of the block copolymer according to the invention makes it possible to adjust the product χN around a high value, typically of greater than 10, in order to enable nanostructuring of the block copolymer into nanodomains, with a period Lo of greater than 30 nm and more preferably still greater than 50 nm and less than 100 nm, while enabling a rapid organization of the blocks (from 1 to a few minutes) at a reduced annealing temperature relative to an unmodified PS-b-PMMA polymer of identical chain length. The reduction of the annealing time and temperature is therefore particularly advantageous for being able to produce nanostructured block copolymers with a large period and without defects.

The number n of blocks of the block copolymer is preferably less than or equal to 7 and, more preferably still, $2 \leq n \leq 3$. In the present invention, even though there is no limitation to the number of blocks of the block copolymer, the synthesis of triblock or diblock copolymers, and preferably diblock copolymers, will especially be considered. In the case of a block copolymer comprising an uneven number of blocks, the two blocks at the ends of the block copolymer could be either the styrene/diphenylethylene copolymer P(S-co-DPE) or the polymethyl methacrylate PMMA.

Given the problems created when a polymer has an excessively high parameter $\chi$, in particular leading to a slowing of the organization kinetics and defect reduction kinetics, the product $\chi N$ of the modified block copolymer must be high enough to obtain an optimum phase segregation, but not too high in order not to lead to problems with the organization kinetics and defect reduction kinetics. In order to obtain a rapid organization of the block copolymer and a nanostructuring period of greater than 30 nm, the product $\chi N$ should preferably be within the range of following values: $75 \leq \chi N \leq 500$, and more preferably still $10 \leq \chi N \leq 200$. Due to the physical definition of the interaction parameter $\chi = (a+b/T)$, where "a" and "b" represent an entropic and enthalpic contribution respectively, and T represents the temperature (in Kelvin), this amounts to writing that the block copolymer should preferably satisfy the relationship $10 \leq N(a+b/T) \leq 200$. T represents the block copolymer organization temperature, i.e. the annealing temperature at which a phase separation between the various blocks, an orientation of the nanodomains obtained and a reduction in the number of defects are obtained. Owing to the introduction of DPE into the PS block of the block copolymer, the entropic and enthalpic contributions of the block copolymer are modified. This modification of the contributions has an influence on the annealing temperature and kinetics enabling the organization of the blocks. Due to this modification, the temperature T may then be lowered relative to the annealing temperature of a base, i.e. unmodified, PS-b-PMMA copolymer. It is preferably below or equal to 230° C., and more preferably still it is below or equal to 210° C. Such an annealing temperature is below the degradation temperature of the block copolymer and consequently avoids the appearance of a very high concentration of defects in the modified block copolymer, at the time of its organization into nanodomains, and which may sometimes lead to the destruction of the polymer.

Advantageously, the modification of the block copolymer backbone does not disturb the properties linked to the chemistry of the base, i.e. unmodified, PS-b-PMMA block copolymer. Thus, the modified block copolymer retains a high glass transition temperature Tg, a good temperature resistance and a depolymerization of the blocks containing PMMA under UV, etc.

The block copolymer therefore comprises at least one copolymer block formed from styrene monomers and diphenylethylene DPE comonomers and at least one other copolymer block formed from methyl methacrylate MMA monomers. The styrene S and diphenylethylene DPE comonomers of the P(S-co-DPE) copolymer block may have an arrangement of statistical or gradient type.

The synthesis of the block copolymer may be a sequential synthesis. In this case, whether by radical, cationic or anionic polymerization, the first block of P(S-co-DPE) is firstly synthesized with a first mixture of styrene and DPE monomers, then, secondly, the MMA monomers of the other block are introduced. In the case of a radical polymerization, it is possible to obtain a block copolymer by introducing all of the monomers concomitantly, batchwise or continuously, provided that sufficiently high reactivity ratios between each monomer are adhered to.

In the modified block copolymer, the sequence of the various copolymer blocks may adopt either a linear structure, via a synthesis carried out sequentially for example, or a star structure, when the synthesis is carried out using a multifunctional initiator for example. Production of this modified block copolymer may also be envisaged by grafting the various pre-synthesized blocks to one another, by means of the reactive ends.

The reaction for copolymerization of the P(S-co-DPE) bloc and of the PMMA block may be carried out by customary techniques, i.e. controlled radical polymerization, anionic polymerization or ring-opening polymerization, etc.

When the polymerization process is carried out via a controlled radical route, any controlled radical polymerization technique could be used, whether it is NMP ("Nitroxide Mediated Polymerization"), RAFT ("Reversible Addition and Fragmentation Transfer"), ATRP ("Atom Transfer Radical Polymerization"), INIFERTER ("Initiator-Transfer-Termination"), RITP ("Reverse Iodine Transfer Polymerization") or ITP ("Iodine Transfer Polymerization). Preferably, the polymerization process via controlled radical polymerization will be carried out by NMP.

More particularly, the nitroxides resulting from alkoxyamines derived from the stable free radical (1) are preferred.

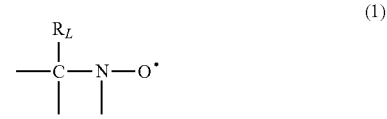
(1)

in which the radical $R_L$ has a molar mass of greater than 15.0342 g/mol. The radical $R_L$ may be a halogen atom such as chlorine, bromine or iodine, a saturated or unsaturated, linear, branched or cyclic hydrocarbon-based group such as an alkyl or phenyl radical, or an ester group —COOR or an alkoxyl group —OR, or a phosphonate group —PO(OR)$_2$, as long as it has a molar mass of greater than 15.0342. The radical $R_L$, which is monovalent, is said to be in the β position with respect to the nitrogen atom of the nitroxide radical. The remaining valencies of the carbon atom and of the nitrogen atom in formula (1) may be bonded to various radicals such as a hydrogen atom, a hydrocarbon-based radical such as an alkyl, aryl or arylalkyl radical, comprising from 1 to 10 carbon atoms. It is not out of the question for the carbon atom and the nitrogen atom in formula (1) to be connected together by means of a divalent radical so as to form a ring. Preferably however, the remaining valences of the carbon atom and of the nitrogen atom of formula (1) are bonded to monovalent radicals. Preferably, the radical $R_L$ has a molar mass of greater than 30 g/mol. The radical $R_L$ may for example have a molar mass of between 40 and 450 g/mol. By way of example, the radical $R_L$ may be a radical comprising a phosphoryl group, it being possible for said radical $R_L$ to be represented by the formula:

(2)

in which $R^3$ and $R^4$, which may be identical or different, may be chosen from alkyl, cycloalkyl, alkoxyl, aryloxyl, aryl, aralkyloxyl, perfluoroalkyl and aralkyl radicals, and may comprise from 1 to 20 carbon atoms. $R^3$ and/or $R^4$ may also be a halogen atom such as a chlorine or bromine or fluorine or iodine atom. The radical $R_L$ may also comprise at least one aromatic ring such as for the phenyl radical or naphthyl radical, it being possible for the latter to be substituted, for example with an alkyl radical comprising from 1 to 4 carbon atoms.

More particularly, the alkoxyamines derived from the following stable radicals are preferred:
N-(tert-butyl)-1-phenyl-2-methylpropyl nitroxide,
N-(tert-butyl)-1-(2-naphtyl)-2-methylpropyl nitroxide,
N-(tert-butyl)-1-diethylphosphono-2,2-dimethylpropyl nitroxide,
N-(tert-butyl)-1-dibenzylphosphono-2,2-dimethylpropyl nitroxide,
N-phenyl-1-diethylphosphono-2,2-dimethylpropyl nitroxide,
N-phenyl-1-diethylphosphono-1-methylethyl nitroxide,
N-(1-phenyl-2-methylpropyl)-1-diethylphosphono-1-methylethyl nitroxide,
4-oxo-2,2,6,6-tetramethyl-1-piperidinyloxy,
2,4,6-tri-(tert-butyl)phenoxy.

Preferably, the alkoxyamines derived from N-(tert-butyl)-1-diethylphosphono-2,2-dimethylpropyl nitroxide will be used.

During the controlled radical polymerization, the residence time in the polymerization reactor has an influence on the value of the Flory-Huggins parameter $\chi$ of the final block copolymer. Specifically, due to the different reactivities of the co-monomers to be incorporated into the P(S-co-DPE) copolymer block, they are not all incorporated into the chain at the same rate. Consequently, depending on the residence time, the relative proportions of the various comonomers in the copolymer blocks will be different and therefore the value of the parameter $\chi$ of the final block copolymer also varies. In general, in radical polymerization, it is sought to obtain degrees of conversion of the order of 50-70%. Consequently, a maximum residence time in the polymerization reactor, corresponding to these degrees of conversion, is set. Thus, in order to obtain a degree of conversion of 50% to 70%, the starting ratio of the comonomers to be polymerized is modified. For this, use may be made of nomograms that make it possible to determine the relationship between the starting ratio of comonomers to be polymerized and the degree of conversion on the one hand, and between the molecular weight of the block copolymer and the $\chi N$ on the other hand.

When the polymerization process is carried out via an anionic route, which is the preferred route used in the invention, any mechanism of anionic polymerization may be considered, whether it is ligated anionic polymerization or else ring-opening anionic polymerization.

In the preferred context of the invention, use will be made of an anionic polymerization process in an apolar solvent, preferably toluene, as described in patent EP 0 749 987, and which involves a micromixer.

The relative proportions, as monomer units, of DPE comonomer in the styrene-based copolymer block are then between 1% and 25%, and preferably between 1% and 10%, limits included, relative to the styrene comonomer with which it copolymerizes.

Within the limit of these proportions, the greater the number of DPE comonomer units incorporated in the styrene-based block, the more significantly the $\chi N$ will be modified with respect to that of a PS-b-PMMA of which the blocks are pure, and the more it will then be possible to nanostructure the copolymer with a large period.

Furthermore, the molecular weight M of each copolymer block is preferably between 15 and 100 kg/mol, and more preferably still between 30 and 100 kg/mol, limits included, and the dispersity index PDi is preferably less than or equal to 2, and more preferably still it is between 1.02 and 1.7 (limits included).

Such a block copolymer, one block of which has a chemical structure modified by incorporation of DPE comonomers, may be used in various application processes such as lithography, to produce lithography masks in particular, or else the manufacture of membranes, the functionalization and coating of surfaces, the manufacture of inks and composites, surface nanostructuring, the manufacture of transistors, diodes or organic memory cells for example.

The invention also relates to a process for controlling the nanostructuring period of a block copolymer film using a block copolymer based on PS-PMMA. Such a process makes it possible to control the nanostructuring period by adjusting the phase segregation ($\chi N$) between the blocks of this block copolymer, the chemical structure of which is modified. For this, following the synthesis of the modified block copolymer, the latter is applied in solution to a surface, in order to form a film. The solvent of the solution is then evaporated off and the film is subjected to a heat treatment. This heat treatment, or annealing, enables the block copolymer to become correctly organized, i.e. to obtain in particular a phase separation between the nanodomains, an orientation of the domains and a reduction in the number of defects. Preferably, the temperature T of this heat treatment is $\leq 230°$ C., and more preferably still $\leq 210°$ C. The block copolymer film obtained has ordered structuring for a molecular weight of greater than 50 kg/mol, and preferably greater than 100 kg/mol and less than 250 kg/mol, whereas a film of PS-b-PMMA that is not chemically modified cannot be structured in an ordered manner for the same molecular weight since such structuring requires annealing temperatures and times such that an excessively large amount of defects appear and prevents the ordered nanostructuring of the copolymer to be produced.

Advantageously, the annealing of such a modified block copolymer, the molecular weight of which is high and greater than 50 kg/mol, and preferably greater than 100 kg/mol and less than 250 kg/mol, and the value of $\chi N$ of which is greater than 10 enables nanostructuring with organization kinetics of the order of 1 to a few minutes. Preferably, the organization kinetics are less than or equal to 5 minutes, more preferably still they are less than or equal to 2 minutes, and between 1 and 2 minutes.

In the case of lithography, the desired structuring, for example the generation of nanodomains perpendicular to the surface, requires however the prior preparation of the surface on which the copolymer solution is deposited for the purpose of controlling the surface energy. Among the known possibilities, deposited on the surface is a statistical copolymer, forming a neutralizing layer, the monomers of which may be completely or partly identical to those used in the block copolymer that it is desired to deposit. In a pioneering article, Mansky et al. (Science, vol. 275, pages 1458-1460, 1997) clearly describe this technology, now well known to a person skilled in the art.

Among the favoured surfaces, mention may be made of surfaces consisting of silicon, the silicon having a native or thermal oxide layer, germanium, platinum, tungsten, gold, titanium nitrides, graphenes, BARC (bottom anti-reflective coating) or any other anti-reflective layer used in lithography.

Once the surface is prepared, a solution of modified block copolymer according to the invention is deposited, then the solvent is evaporated off according to techniques known to a person skilled in the art, such as for example the "spin coating", "doctor blade", "knife system" or "slot die system" technique, but any other technique may be used such as dry deposition, i.e. deposition without involving a prior solubilization.

Heat treatment is then carried out, which enables the block copolymer to become correctly organized, i.e. to obtain in particular a phase separation between the nanodomains and an orientation of the domains while obtaining a defectivity that is significantly reduced relative to that obtained with unmodified block copolymers having identical chain lengths. This annealing step, enabling the nanostructuring of the block copolymer film, may be carried out under a solvent atmosphere, or thermally, or by a combination of these two methods.

The process for controlling the nanostructuring period of block copolymers according to the invention therefore makes it possible, in particular in the case of base copolymers having a high degree of polymerization, to obtain nanostructured copolymer films with a defectivity that is significantly reduced relative to the unmodified copolymer.

Furthermore, the applicant has also observed that the introduction of DPE into the PS block, with a content preferably of between 1% and 25% and preferably of between 1% and 10%, advantageously makes it possible to obtain defect-free nanostructuring for thicker film thicknesses than those obtained using the unmodified block copolymer. These thicknesses may be greater than or equal to 30 nm and even greater than 40 nm without the appearance of defects. With an unmodified block copolymer, it is not possible to reach such thicknesses without defects. A large thickness allows better control of the lithography process, since the transfer of the nanostructured patterns in the substrate by (dry or wet) etching is highly dependent on the thickness of the films used as masks: films of which the thickness is less than 40 nm will not enable an effective transfer in the substrate, whereas thicker films will lead to higher aspect ratios.

A PS-b-PMMA block copolymer of high molecular weight, typically of greater than 50 kg/mol, and preferably greater than 100 kg/mol and less than 250 kg/mol, and that is modified by introducing DPE into the styrene-based block, therefore makes it possible to obtain an assembly of the blocks perpendicular to the surface on which it is deposited, with a high phase segregation and a large period Lo, typically of greater than 30 nm, and preferably greater than 50 nm and less than 100 nm, this being with a temperature below that necessary for nanostructuring the base, i.e. unmodified, block copolymer, and with rapid organization kinetics. The modified block copolymer has a reduced defectivity relative to the same unmodified block copolymer, and this being even at very large thicknesses. Such a block copolymer therefore enables a better control of the lithography process.

The invention also relates to a nanolithography mask obtained from the modified block copolymer, deposited on a surface to be etched in accordance with the nanostructuring process. The film thus deposited on the surface comprises nanodomains oriented perpendicular to the surface to be etched and has a period of greater than or equal to 30 nm, and preferably greater than 50 nm and less than 100 nm.

The following examples illustrate the scope of the invention in a nonlimiting manner:

Example 1: Synthesis of a P(Styrene-Co-Diphenylethylene)-b-P(Methyl Methacrylate) (P(S-Co-DPE)-b-PMMA) Diblock Copolymer The polymerization equipment used is represented schematically in FIG. 1. A solution of the macroinitiating system is prepared in a vessel C1 and a solution of the monomers is prepared in a vessel C2. The stream from the vessel C2 is sent to an exchanger E in order to be brought to the initial polymerization temperature. The two streams are then sent to a mixer M, which in this example is a static mixer, as described in patent applications EP 0 749 987 and EP 0 524 054, then to the polymerization reactor R which is a standard tube reactor. The product is received in a vessel C3 which is then transferred to a vessel C4 in order to be precipitated therein.

In the vessel C1, a 27.5 wt % solution of the P(S-co-DPE) block in toluene is prepared at 45° C. so that this block is a macroinitiator system for subsequently initiating the PMMA second block. For this, added under an inert atmosphere of nitrogen are a solution of toluene and 133 ml of s-butyllithium at 1.5M in hexane, to which 4 kg of a mixture of styrene/1,1-diphenylethylene at 90/10 by weight are added. After 2 h of polymerization at 45° C., the temperature of the vessel C1 is lowered to −20° C. and a solution of lithium methoxyethanolate and also 72.1 g of 1,1-diphenylethylene in toluene are added so as to obtain a molar ratio of 1/6 between the poly(styryl-co-1,1-diphenylethyl)$CH_2C(Ph)_2Li$ and the $CH_3OCH_2CH_2OLi$. The toluene solution is a 23.2 wt % solution. The [poly(styryl-co-1,1-diphenylethyl)$CH_2C(Ph)_2Li$]/[$CH_3OCH_2CH_2OLi$]$_6$ macroinitiating system is then obtained. These syntheses are also described in patent applications EP 0 749 987 and EP 0 524 054.

A solution composed of MMA, previously passed over an alumina molecular sieve, at a concentration of 6.2 wt % in toluene is stored at −15° C. in vessel C2.

The stream of the macroinitiating system solution is adjusted to 60 kg/h. The stream of the MMA solution of vessel C2 is sent to an exchanger so that the temperature therein is lowered to −20° C. and the stream of the MMA solution is adjusted to 56 kg/h. The two streams are then mixed in the static mixer then recovered in a vessel C3 where the copolymer is deactivated by the addition of a methanol solution.

The conversion determined by measuring the solid content is greater than 99%.

The content of the vessel C3 is then precipitated dropwise in a vessel C4, with stirring, containing heptane. The volume ratio between the content of the vessel C3 and that of C4 is 1/7. At the end of the addition of the solution of the vessel C3, the stirring is stopped and the copolymer settles. It is then recovered by elimination of the supernatant and filtration.

After drying, the characteristics of the copolymer are the following:

Mp of copolymer=55.4 kg/mol

Dispersity: 1.09

P(S-co-DPE)/PMMA weight ratio=69.8/30.2

Various base, i.e. unmodified, PS-b-PMMA block copolymers were synthesized according to this process with various compositions (i.e. with various contents of PS and PMMA) and various modified P(S-co-DPE)-b-PMMA block copolymers were also synthesized according to this process with different compositions in order to be able to carry out comparisons illustrated below in the comparative examples A to C of Example 4.

The various compositions of the various block copolymers synthesized are collated in Table 1 presented below.

TABLE I

| Block copolymer reference | Mp of PS (kg/mol)[a] | Mp of PMMA (kg/mol)* | Mp of copolymer (kg/mol)* | Dispersity[a] | PS block wt % PS[b] | wt % DPE[b] | PMMA block wt % PMMA[b] |
|---|---|---|---|---|---|---|---|
| C35 V1 | 38.6 | 17.6 | 56.2 | 1.06 | 68.7 | 0 | 31.3 |
| C35 V3 | 38.1 | 15.9 | 54 | 1.06 | 70.6 | 0 | 29.4 |
| C35 1DPE | 40.8 | 21.6 | 62.4 | 1.10 | 64.8 | 0.6 | 34.6 |
| C35 10DPE | 38.7 | 16.7 | 55.4 | 1.09 | 65.2 | 4.6 | 30.2 |
| C50 V2 | 74 | 29.2 | 103.2 | 1.15 | 71.7 | 0 | 29.3 |
| C50 10DPE | 91.2 | 36 | 127.2 | 1.12 | 67.4 | 4.6 | 28.0 |

[a]Determined by size exclusion chromatography. The polymers are dissolved at 1 g/l in THF stabilized with BHT. The calibration is carried out using monodisperse polystyrene standards. Dual detection by refractive index and UV at 254 nm makes it possible to determine the percentage of polystyrene in the copolymer.
[b]Determined by 1H NMR
*Determined by calculation from the weight Mp PS determined by size exclusion chromatography SEC and the composition determined by 1H NMR.

Example 2: Synthesis of a PS-Stat-PMMA Neutralizing Layer $1^{st}$ step: preparation of a hydroxy-functionalized alkoxyamine from the commercial alkoxyamine BlocBuilder® (ARKEMA):
Introduced into a 1 L round-bottomed flask purged with nitrogen are:
226.17 g of BlocBuilder® (1 equivalent)
68.9 g of 2-hydroxyethyl acrylate (1 equivalent)
548 g of isopropanol
The reaction mixture is heated at reflux (80° C.) for 4 h then the isopropanol is evaporated under vacuum. 297 g hydroxy-functionalized alkoxyamine is obtained in the form of a highly viscous yellow oil.

$2^{nd}$ step: Experiment protocol for preparing PS/PMMA statistical copolymer from the alkoxyamine from step 1.

Toluene, and also the monomers such as styrene (S), methyl methacrylate (MMA), and the functionalized alkoxyamine from step 1 are introduced into a jacketed stainless steel reactor equipped with a mechanical stirrer. The weight ratios between the various styrene (S) and methyl methacrylate (MMA) monomers are described in Table 2 below. The toluene loading by weight is set at 30% with respect to the reaction medium. The reaction mixture is stirred and degassed by nitrogen bubbling at ambient temperature for 30 minutes.

The temperature of the reaction medium is then brought to 115° C. The time t=0 is triggered at ambient temperature. The temperature is maintained at 115° C. throughout the polymerization until a conversion of the monomers of the order of 70% is achieved. Samples are withdrawn at regular intervals in order to determine the polymerization kinetics via gravimetric analysis (measurement of solids content).

When the conversion of 70% is achieved, the reaction medium is cooled to 60° C. and the solvent and residual monomers are evaporated under vacuum. After evaporation, methyl ethyl ketone is added to the reaction medium in an amount such that a copolymer solution of the order of 25% by weight is produced.

This copolymer solution is then introduced dropwise into a beaker containing a non-solvent (heptane), so as to precipitate the copolymer. The weight ratio of solvent to nonsolvent (methyl ethyl ketone/heptane) is of the order of 1/10. The precipitated copolymer is recovered in the form of a white powder after filtration and drying.

| | Initial reaction state | | Characteristics of the copolymer | | | | |
|---|---|---|---|---|---|---|---|
| Neutralizing layer reference | Initial composition by weight of the S/MMA monomers | Weight ratio of alkoxyamine relative to the S and MMA monomers | % PS[a] | Mp[a] g/mol | Mn[a] g/mol | Mw[a] g/mol | Ip[a] g/mol |
| MGCL04 | 66/34 | 0.03 | 65% | 15 480 | 11 930 | 15 900 | 1.3 |

[a]Determined by size exclusion chromatography. The polymers are dissolved at 1 g/l in THF stabilized with BHT. The calibration is carried out using monodisperse polystyrene standards. Dual detection by refractive index and UV at 254 nm makes it possible to determine the percentage of polystyrene in the copolymer.

Example 3: Process of Nanostructuring a Modified Block Copolymer Film Based on PS-b-PMMA A silicon substrate is cut manually into 3×3 cm then the pieces are cleaned by a conventional treatment (piranha solution, oxygen plasma, etc.). A statistical PS-stat-PMMA copolymer, as prepared in accordance with Example 2, previously dissolved in propylene glycol monomethyl ether acetate (PGMEA) in a proportion of 2 wt %, is then deposited on the substrate to be functionalized via spin coating or any other deposition technique known to a person skilled in the art, so as to form a polymer film having a thickness of around 60 to 80 nm. This statistical copolymer film then forms a neutralizing layer. The substrate is then heated at a temperature of the order of 230° C. for 2 to 5 minutes so as to graft the polymer chains to the surface.

The substrate is subsequently rinsed copiously in PGMEA so as to eliminate the excess ungrafted polymer chains, and then the functionalized substrate is dried under a stream of nitrogen.

The modified PS-b-PMMA block polymer, as synthesized and described above in Example 1, is dissolved in PGMEA in a proportion of 1 wt % to 2 wt % depending on the targeted film thickness, and is deposited on the surface via spin coating so as to form a film of desired thickness. By way of example, a 1.5 wt % solution could give a block copolymer film having a thickness of around 45 to 50 nm, when it is deposited on the surface via the spin coating technique at 2000 rpm. The film thus formed is then annealed between 210° C. and 230° C. (depending on the case) for 2 minutes in order to enable the nanostructuring of the blocks into nanodomains.

It is noted that in this example, a silicon substrate was used. Obviously, this method could be transposed without any major modification to any other substrate of interest for electronics described in patent application no. FR 2 974 094.

Example 4: Comparative Examples

A) Influence of the Composition of the Modified Block Copolymer on the Nanostructuring Conditions and on the Period Lo Represented in FIG. 2 are photos, taken using a scanning electron microscope, of various samples of modified or unmodified block copolymers, the compositions of which are collated in Table I above with regard to Example 1, and that are nanostructured in accordance with the invention. Also indicated in FIG. 2 are the annealing temperatures and times of each block copolymer and also the period and the thickness of each of the samples.

It is observed that for comparable copolymer molecular weights, i.e. having a comparable degree of polymerization N, the unmodified block copolymer C35, which is annealed at 220° C. for a duration of 2 minutes, has a high defectivity for a period of the order of 30 nm and a thickness of 19 nm, whereas the modified copolymers C35 1DPE and C35 10 DPE, which are annealed at temperatures respectively of 220° C. and 210° C. for a duration of 2 minutes have a larger period Lo, respectively 36 nm and greater than 40 nm and a significantly reduced defectivity at a comparable thickness of 20 nm and even at a large thickness of 44 nm.

Similarly, for polymers of which the degree of polymerization N is higher still, i.e. the copolymers C50 and C50 10 DPE, the molecular weights of which are respectively 103.2 and 127.2 kg/mol, it is observed that the incorporation of DPE makes it possible to reduce the annealing temperature and/or the annealing time and to obtain block copolymers having a large period (greater than 50 nm), without the appearance of defects.

It therefore results from this FIG. 2 that the incorporation of DPE into the styrene block of the initial PS-b-PMMA block copolymer having a high molecular weight, of greater than 50 kg/mol, and preferably greater than 100 kg/mol and less than 250 kg/mol, makes it possible to reduce the annealing time and/or temperature for organizing the blocks of the copolymer so that it becomes nanostructured with a large period, typically of greater than 30 nm, and this being without defects.

B) Influence of the Annealing Temperature on the Defectivity as a Function of the Thickness FIG. 3 represents photos A to D, taken using a scanning electron microscope, of the copolymer C35 10 DPE, the composition of which is described in Table I above, deposited on a neutralizing layer, the synthesis of which is described above with regard to Example 2, having various thicknesses and after different annealing conditions.

More particularly, four samples of the P(S-co-DPE)-b-PMMA block copolymer, containing 4.6% of DPE in the PS block, the thicknesses of which are respectively 19 and 24 nm, were subjected to a 5 minute annealing at a temperature of 200° C. (photos C and D) and at a temperature of 180° C. (photos A and B).

It results from these comparisons that, irrespective of the thickness of the sample, a reduction in the annealing temperature makes it possible to obtain a substantially reduced defectivity.

C) Influence of the Annealing Time on the Defectivity

FIG. 4 represents photos, taken using a scanning electron microscope, of two samples E and F of copolymer C35 10DPE containing 4.6% DPE in the PS block, and the thickness of which is equal to 19 nm, the samples having been annealed at 180° C. for respective durations of 5 and 2 minutes. It results from this comparison that a reduction of the annealing time substantially reduces the defectivity of the nanostructured block copolymer film.

The addition of DPE to initial PS-b-PMMA copolymers, of high molecular weight, therefore makes it possible to organise the blocks at a temperature below that used for organizing the blocks of the initial copolymers and with very fast kinetics, and this being with a significantly reduced defectivity. An additional advantage lies in the fact that the defectivity is reduced even for large thicknesses, typically of greater than 40 nm, as can be observed in FIG. 2.

The invention claimed is:

1. A block copolymer film nanostructured into nanodomains, obtained from a base block copolymer having a molecular weight Mp of greater than 50 kg/mol and at least one block of which is a styrene-based block formed by a P(S-co-DPE) copolymer of styrene and diphenylethylene (DPE), and at least one other block of which comprises methyl methacrylate,
  wherein the relative proportions, as monomer units, of diphenylethylene (DPE) incorporated into the styrene-based block are between 1% and 25%, relative to the styrene comonomer with which it copolymerizes.

2. The copolymer film according to claim 1, wherein the molecular weights Mp of each block are between 15 kg/mol and 100 kg/mol, with a dispersity index of less than or equal to 2.

3. The block copolymer film according to claim 1, wherein the number n of blocks Is such that n≤7.

4. The block copolymer film according to claim 1, wherein the comonomers of the styrene-based block (P(S-co-DPE)) have a statistical or gradient arrangement.

5. The block copolymer film according to claim 1, obtained from a base block copolymer having a molecular weight Mp of greater than 100 kg/mol and less than 250 kg/mol.

6. The block copolymer film according to claim 1, wherein the relative proportions, as monomer units, of diphenylethylene (DPE) incorporated into the styrene-based block are between 1% and 10%, relative to the styrene comonomer with which it copolymerizes.

7. The copolymer film according to claim 1, wherein the molecular weights Mp of each block are between 30 kg/mol and 100 kg/mol, with a dispersity Index of between 1.02 and 1.70.

8. The block copolymer film according to claim 1, wherein the number n of blocks Is such that 2≤n≤3.

9. The block copolymer film according to claim 1, wherein the relative proportions, as monomer units, of diphenylethylene (DPE) incorporated into the styrene-based block are between 4.6% and 25%, relative to the styrene comonomer with which it copolymerizes.

10. The block copolymer film according to claim 1, wherein
the product χN of the block copolymer is greater than or equal to 7;
χ is the phase segregation parameter;
N is the degree of polymerization of the block copolymer; and
the nanodomains have a period to greater than 30 nm.

11. A process for controlling the period of nanostructuring, into nanodomains, of a block copolymer film using a base block copolymer having a molecular weight Mp of greater than 50 kg/mol, and at least one block of which comprises styrene, and at least one other block of which comprises methyl methacrylate, wherein said process comprises the following steps:
synthesizing said block copolymer by incorporating, into the block of said base block copolymer containing styrene, one or more diphenylethylene (DPE) comonomers so as to form a P(S-co-DPE) copolymer block,
applying a solution of said block copolymer in the form of a film to a surface,
evaporating the solvent of the solution and annealing at a predetermined temperature,
wherein the relative proportions, as monomer units, of the diphenylethylene (DPE) comonomers incorporated into the styrene-based block are between 1% and 25%, relative to the styrene comonomer with which it copolymerizes.

12. The process according to claim 11, wherein the synthesis is carried out by controlled radical polymerization.

13. The process according to claim 11, wherein the synthesis is carried out by anionic polymerization.

14. The process according to claim 11, wherein the annealing step enables a nanostructuring of the block copolymer film deposited on said surface and is carried out at a temperature T below 230° C.

15. The process according to claim 11, wherein the annealing step enabling the nanostructuring of the block copolymer film is carried out under a solvent atmosphere, or thermally, or by a combination of these two methods.

16. The process according to claim 11, wherein at the time of the annealing step, the copolymer blocks become organized Into nanodomains with kinetics of less than or equal to 5 minutes.

17. The process according to claim 11, wherein the base block copolymer has a molecular weight Mp of greater than 100 kg/mol and less than 250 kg/mol.

18. The process according to claim 11, wherein the annealing step enables a nanostructuring of the block copolymer film deposited on said surface and is carried out at a temperature T below 210° C.

19. The process according to claim 11, wherein at the time of the annealing step, the copolymer blocks become organized into nanodomains with kinetics of between 1 and 2 minutes.

20. The process according to claim 11, wherein the relative proportions, as monomer units, of diphenylethylene (DPE) incorporated into the styrene-based block are between 1% and 10%, relative to the styrene comonomer with which it copolymerizes.

21. The process according to claim 11, wherein the relative proportions, as monomer units, of diphenylethylene (DPE) incorporated into the styrene-based block are between 4.6% and 25%, relative to the styrene comonomer with which it copolymerizes.

22. The process according to claim 11, wherein
the product of χN of the block copolymer is greater than or equal to 7;
χ is the phase segregation parameter;
N is the degree of polymerization of the block copolymer;
the block copolymer film is nanostructured into nanodomains; and
the nanodomains have a period Lo greater than 30 nm.

23. A nanolithography mask obtained from the block copolymer film according to claim 1, deposited on a surface to be etched, said copolymer film comprising nanodomains oriented perpendicular to the surface to be etched and having a period Lo of greater than or equal to 30 nm.

* * * * *